United States Patent [19]

Krisch et al.

[11] 4,044,256
[45] Aug. 23, 1977

[54] SUPPORT STAND FOR A CORPUSCULAR-BEAM MICROSCOPE

[75] Inventors: Burkhard Krisch; Karl-Heinz Müller; Moriz von Rauch, all of Berlin, Germany; Lee H. Veneklasen, San Leandro, Calif.

[73] Assignee: Siemens Aktiengesellschaft, Munich, Germany

[21] Appl. No.: 719,140

[22] Filed: Aug. 31, 1976

[30] Foreign Application Priority Data

Sept. 9, 1975 Germany ............................ 2540595

[51] Int. Cl.² ............................................ G01M 23/00
[52] U.S. Cl. ...................................... 250/311; 250/306
[58] Field of Search ........................ 250/311, 306, 309

[56] References Cited

U.S. PATENT DOCUMENTS

| | | | |
|---|---|---|---|
| 2,370,373 | 2/1945 | Ruska et al. | 250/311 |
| 3,772,510 | 11/1973 | Mertens et al. | 250/311 |

Primary Examiner—Harold A. Dixon
Attorney, Agent, or Firm—Kenyon & Kenyon, Reilly, Carr & Chapin

[57] ABSTRACT

A corpuscular-beam microscope including a support stand, a columnar housing containing the optical elements of the microscope, electronic control and regulating means for generating and transmitting voltage signals to parts of a beam generator of the microscope which are at high-voltage potential, and at least one high-vacuum pump for evacuating the microscope housing. The improvement of the invention comprises the support stand comprising a horizontal base member and a flexure-resistant vertical support member disposed on the base member. The microscope housing, the control and regulating means, and the pump are mounted on different sides of the support member and are arranged so that the center of gravity of the support stand is disposed between the support member and the optical axis of the microscope near the axis.

3 Claims, 3 Drawing Figures

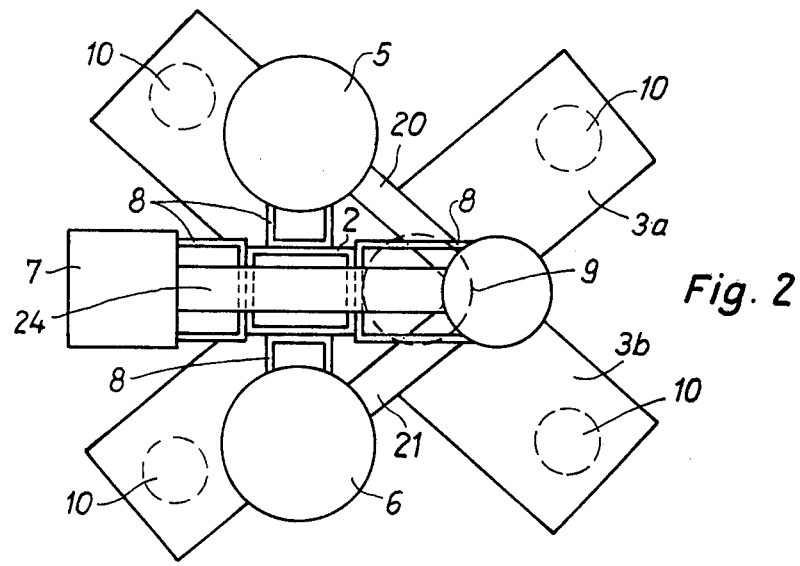
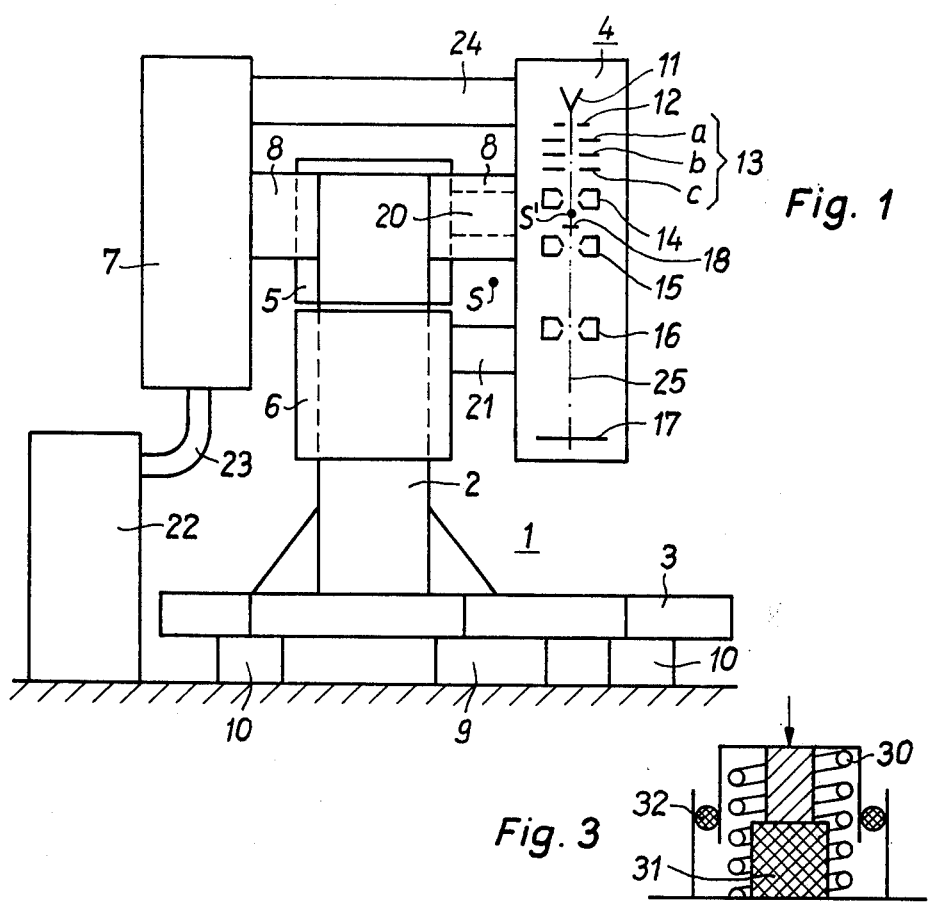

SUPPORT STAND FOR A CORPUSCULAR-BEAM MICROSCOPE

BACKGROUND OF THE INVENTION

1. Field of the Invention

This invention relates generally to corpuscular-beam microscopes, such as, for example, an electron microscope, and in particular to an improved support stand for such microscopes for supporting a housing containing the optical elements of the microscope, an electronic control and regulating means for supplying voltage signals to parts of a beam generator of the microscope which are disposed at high-voltage potential, and a high-vacuum pump for evacuating the microscope housing.

2. DESCRIPTION OF THE PRIOR ART

In an electron microscope, the support stand for the microscope generally comprises an operating console on which the microscope housing or column is mounted. This console usually contains a vacuum system for evacuating the microscope housing which includes high-vacuum pumps. The high-voltage supply equipment and the associated control and regulating units are, in contrast, disposed in a separate cabinet and are coupled to the beam generator of the microscope by means of a multi-conductor high-voltage cable. See, for example, Siemens publication "ELMISKOP IA" (1966). The disadvantage of this arrangement is that a plug connection is required between the high-voltage cable and the beam generator of the microscope which is technically complex because of insulation requirements.

SUMMARY OF THE INVENTION

It is therefore an object of the present invention to overcome the aforementioned disadvantages of heretofore known microscopes and to provide an improved support stand for a corpuscular-beam microscope which facilitates access to the elements comprising the microscope and which simplifies the interconnection of the elements of the microscope.

These and other objects of the invention are achieved in a corpuscular-beam microscope which includes a support stand, a columnar housing containing the optical elements of the microscope, an electronic control and regulating means for generating and transmitting voltage signals to parts of a beam generator of the microscope which are at high-voltage potential, and at least one high-vacuum pump for evacuating the microscope housing. The improvement of the invention comprises the support stand comprising a horizontal base member and a flexure-resistant (i.e., resistant to bending) vertical support member disposed on the base member. The microscope housing, the control and regulating means, and the pump are mounted on different sides of the support member and are arranged so that the center of gravity of the support stand is disposed between the support member and the optical axis of the microscope near the axis.

The foregoing invention permits free and simple access to all the elements of the microscope to permit servicing and repair work. In addition, the connections between the high-vacuum pumps of the microscope and the microscope housing is shortened, and the high-voltage cable used in heretofore known microscopes is replaced by a fixed connection between the control and the regulating unit and the beam generator of the microscope. Arranging the elements of the microscope on the support stand so that the center of gravity of the stand lies between the support member and the microscope housing inhibits the generation of flexural vibrations of the microscope housing which affect the stability of the image generated by the microscope.

The microscope may further comprise a mechanical connection member disposed between the support member and the microscope housing at approximately the height of the center of gravity of the housing for mounting the housing on the support member. This mechanical connection member also inhibits the generation of flexural vibrations of the microscope housing which affect the stability of the microscope.

In a further embodiment of the invention, at least one central and three peripheral resilient vibration-damping pad members are disposed below the base member for supporting the base member. The central pad member is disposed approximately underneath the center of gravity of the support stand and comprises at least one half of the total weight of the support stand. The peripheral pad members damp tilting vibrations of the support stand and the central pad member attenuates, for the most part, vertical vibrations of the support stand.

The support stand of the invention has the particular advantage that the base member can be relatively light in weight. Previously, a heavy pedestal support stand above the pad members was usually considered to be necessary. See, for example, Journal of Scientific Instruments, Vol. 44, No. 9 (1967), pp. 747 ff., particularly p. 749.

These and other novel features and details of the invention will be described in greater detail in the following detailed description.

BRIEF DESCRIPTION OF THE DRAWINGS

In the drawings, wherein similar reference numerals denote similar elements throughout the several views thereof:

FIG. 1 is a side plan view of an improved support stand for a corpuscular-beam microscope constructed according to the present invention;

FIG. 2 is a top plan view of the support stand illustrated in FIG. 1; and

FIG. 3 is a schematic, sectional view of one embodiment of a pad member for use in a support stand constructed according to the present invention.

DETAILED DESCRIPTION

Referring now to the drawings, and in particular to FIGS. 1 and 2, there is shown a support stand 1 comprising a hollow, rectangular-shaped vertical support member 2 and a horizontal base member 3 disposed on the support member. A columnar microscope housing 4 is mounted on support member 2. Two vibration-free, high-vacuum pumps 5 and 6, which may comprise, for example, ion getter pumps, and an electronic control and regulating unit 7 are also mounted on support member 2. A plurality of horizontally-disposed connection members 8, which are resistant to bending, support each of the microscope elements on support member 2. Base member 3 comprises a pair of crossed beams 3a and 3b and is disposed on five resilient, vibration-damping pad members, in particular a central pad member 9 and four peripheral pad members 10. Microscope housing 4 contains the optical elements of the microscope, which are schematically illustrated in the drawings. The housing also contains the cathode 11 of the microscope, which is disposed at high-voltage potential, for example, at 100 kV. Cathode 11 may comprise a field emission cathode and in such an embodiment, a first anode 12 is provided which operates at a voltage which is only a few kilovolts below the cathode voltage. Several accelerating anodes 13a, 13b and 13c may be provided. The potential of these anodes decreases incrementally to zero from anodes 13a to anode 13c. Below the anodes in housing 4 are disposed a condenser lens 14, an objective lens 15, a projection lens 16 and a fluorescent screen 17. The specimen examined in the microscope is disposed at the location identified by reference numeral 18 in the drawings.

High-vacuum pump 5 is connected by means of a short coupling line 20 having a large diameter to the interior radiation and specimen space of the microscope housing for evacuating this portion of the housing. Pump 6 is coupled by a short coupling line 21 also having a large diameter to the lower chamber of the microscope housing and evacuates this portion of the microscope housing.

The high-voltage d-c potential for operation of the microscope, which may comprise, for example, 100 kV, is generated by a separately mounted high-voltage generator 22 comprising a transformer and a rectifier. Generator 22 is electrically connected by means of a high voltage cable 23 to the control and regulating unit 7. In response to the basic high voltage generated and supplied by generator 22, the control and regulating unit 7 generates the different operating voltages which are required for the high-voltage cathode and anodes of the microscope and simultaneously regulates the generated voltages. The control and regulating unit 7 is electronically connected to the electrical components of the microscope in housing 4 by means of a fixed multi-pole coupling which may be designed, for example, in the same manner as a capacitor bushing. Forepumps, i.e., backing pumps (for vacuum), and lens current supply and operation devices may be coupled to the elements mounted on the support stand by means of flexible coupling lines or other transmission means.

In the embodiment of the support stand shown in the drawings, the distance of the housing 4, pumps 5 and 6, and control and regulating unit 7 from support member 2 of the support stand are chosen so that, considering the weight of these components of the support stand, the center of gravity S of the support stand lies between the support member 2 and optical axis 25 of the microscope near the axis. Central pad member 9 is disposed vertically below the center of gravity S of the support stand beneath base member 3. The connection member 8 on which microscope housing 4 is mounted is fastened to support member 2 at approximately the height of the center of gravity S' of the microscope housing.

Pad members 9 and 10 may comprise, for example, rubber pads having resilient as well as vibration-damping characteristics. Alternatively, pneumatic springs including suitable damping means may also be utilized. Particularly advantageous is a combination of steel and rubber springs, illustrated in FIG. 3, comprising a steel spring 30 and a rubber block 31 disposed in parallel relationship with respect to each other. Such a combination enables the restoring force and the damping properties of the pad to be adapted to the particular requirements of the support stand largely independent of one another. A rubber spring 32 is provided and functions as an elastic and damping stop member in case the pad member is sheared.

The restoring forces of pad members 9 and 10 are preferably designed so that central pad member 9 disposed below the center of gravity S of the support stand comprises at least one half of the total weight of the support stand, and preferably comprises about 70% of the total weight of the stand. With this type of weight balance, it is important that the transmission of vibrations of the floor on which the microscope is disposed, which cause flexural vibrations of the microscope housing 4, are inhibited. The following are the frequencies of the floor vibrations which must be considered:

1. The frequency $f_1$ of the floor vibrations which, depending upon the location, are generally about 5 to 70 Hz.

2. The resonant frequencies $f_2$ of the support stand, including the pad members, as determined by the mass or moment of inertia of the support stand and the elastic properties of the pad members, assuming the support stand above the pad members is rigid. These frequencies comprise one frequency for vertical translation vibrations, and two freuencies for tilting vibrations in each of two orthogonal vertical planes disposed about a point near the mounting plane or a point near the center of gravity of the support stand.

3. The resonant frequencies $f_3$ of the support stand above pad members 9 and 10, determined by the masses, dimensions and elastic properties of the components of the pad members.

4. The lowest resonance frequency $f_4$ of microscope housing 4, i.e., the flexural vibrations, which is about 1 kHz.

The resonant frequencies $f_2$ and $f_3$ may be determined by the design of the support stand and, insofar as is possible, should be chosen so that the frequencies $f_1$, $f_2$, $f_3$ and $f_4$, respectively, are spaced apart from each other as far as possible so that the resonances which occur are as weak as possible. This can be accomplished, for example, by choosing the resonant frequencies $f_2$ by an appropriate choice of the pad member properties to be lower than 5 Hz. The resonant frequencies $f_3$ should be much greater compared to 5 Hz, but much lower as compared to 1 kHz and may comprise, for example, 100 Hz.

It should be noted that although the invention has been described with reference to an electron microscope, it is equally applicable to other types of microscopes, for example, ion microscopes.

In the foregoing, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a corpuscular-beam microscope including a support stand, a columnar housing containing optical elements of the microscope, an electronic control and regulating means for generating and transmitting voltage signals to parts of a beam generator of the microscope which are at high-voltage potential, and at least one high-vacuum pump for evacuating the microscope housing, the improvement comprising said support stand comprising a horizontal base member and a flexure-resistant vertical support member disposed on said base member, said microscope housing, said control and regulating means. and said pump being mounted on different sides of said support member and beng arranged so that the center of gravity of said support stand is disposed between said support member and the optical axis of the microscope near said axis.

2. The microscope recited in claim 1, further comprising a mechanical connection member, disposed between said support member and said microscope housing at approximately the height of the center of gravity of said microscope housing, for mounting said housing on said support member.

3. The microscope recited in claim 1, further comprising at least one central and three peripheral resilient, vibration-damping pad members disposed below said base member for supporting said base member, said central pad member being disposed approximately underneath the center of gravity of said support stand and comprising at least one half of the total weight of said support stand.

* * * * *